(12) United States Patent
Itabashi et al.

(10) Patent No.: US 8,957,709 B2
(45) Date of Patent: Feb. 17, 2015

(54) DRIVER CIRCUIT POWERED BY TWO POWER SUPPLIES SEQUENTIALLY ACTIVATED

(71) Applicant: Sumitomo Electric Industries, Ltd., Osaka (JP)

(72) Inventors: Naoki Itabashi, Yokohama (JP); Keiji Tanaka, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 14/189,642

(22) Filed: Feb. 25, 2014

(65) Prior Publication Data

US 2014/0245051 A1    Aug. 28, 2014

(30) Foreign Application Priority Data

Feb. 26, 2013  (JP) ................ P2013-035822

(51) Int. Cl.
*H03B 1/00* (2006.01)
*G06F 1/32* (2006.01)

(52) U.S. Cl.
CPC .................... *G06F 1/3287* (2013.01)
USPC .............. 327/108; 327/561; 327/563

(58) Field of Classification Search
None
See application file for complete search history.

(56) References Cited

U.S. PATENT DOCUMENTS

| | | | | |
|---|---|---|---|---|
| 5,430,765 | A * | 7/1995 | Nagahori | 375/318 |
| 8,121,160 | B2 * | 2/2012 | Moto et al. | 372/38.02 |
| 8,279,004 | B2 * | 10/2012 | Wang | 330/261 |
| 8,319,552 | B1 * | 11/2012 | Gilbert | 330/255 |
| 2012/0113999 | A1 | 5/2012 | Tanaka | |

FOREIGN PATENT DOCUMENTS

JP    2012-104582    5/2012

* cited by examiner

*Primary Examiner* — An Luu
(74) *Attorney, Agent, or Firm* — Smith, Gambrell & Russell LLP (57) ABSTRACT

A driver circuit including front and rear amplifiers each powered by the primary and secondary power supplies, where the latter power supply is generated from the former power supply. The rear amplifier includes a cascade transistor whose base bias is provided from the bias source. The bias source provides the base bias to reduce the base current when the primary power supply is active but the secondary power supply is inactive, and to be equal to the primary power supply when two power supplies become active but the rear amplifier is inactive.

18 Claims, 8 Drawing Sheets

DRIVER CIRCUIT POWERED BY TWO POWER SUPPLIES SEQUENTIALLY ACTIVATED

BACKGROUND OF THE INVENTION

1. Field of the Invention

The present application relates to a driver circuit implemented within an transmitter optical module, in particular, the application relates to a driver circuit powered by two power supplies which are sequentially activated.

2. Related Background Art

A driver circuit implemented within a transmitter optical module has been requested to output signals with large amplitude for driving an optical device. A United States Patent Application US20120113999A has disclosed a driver circuit able to output a signal with enough amplitude. In order to obtain the output with enough amplitude, an output stage of the driver circuit is preferably powered by a power supply with a higher voltage. However, when the higher power supply is a kind of boosting circuit powered by a lower power supply, instable conditions between the power supplies may occur, which possibly degrades active devices and sometimes damages them.

SUMMARY OF THE INVENTION

An aspect of the present application relates to a driver circuit that drives a semiconductor optical device, such as an electro-absorption modulator. The driver circuit includes a front amplifier powered by a primary power supply, a rear amplifier powered by a secondary power supply, a booster to boost the primary power supply to the secondary power supply. The rear amplifier of an embodiment includes a load resistor, a cascade transistor, a switching transistor, and a current source, where they are connected in series between the secondary power supply and the ground. The rear amplifier further includes a bias source to set the base bias of the cascade transistor such that, when the primary power supply becomes active but the secondary power supply is left inactive, the base bias for the cascade transistor is lowered to reduce the base current of the cascade transistor; while, when both of the primary power supply and the secondary power supply are active but the current source of the rear amplifier is left inactive, the base bias is set substantially equal to the primary power supply.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF THE PREFERRED EMBODIMENTS

Next, some embodiments of the present application will be described as referring to drawings. In the description of the drawings, numerals or symbols same or similar to each other will refer to elements same or similar to each other without duplicated explanations.

Figure 1:
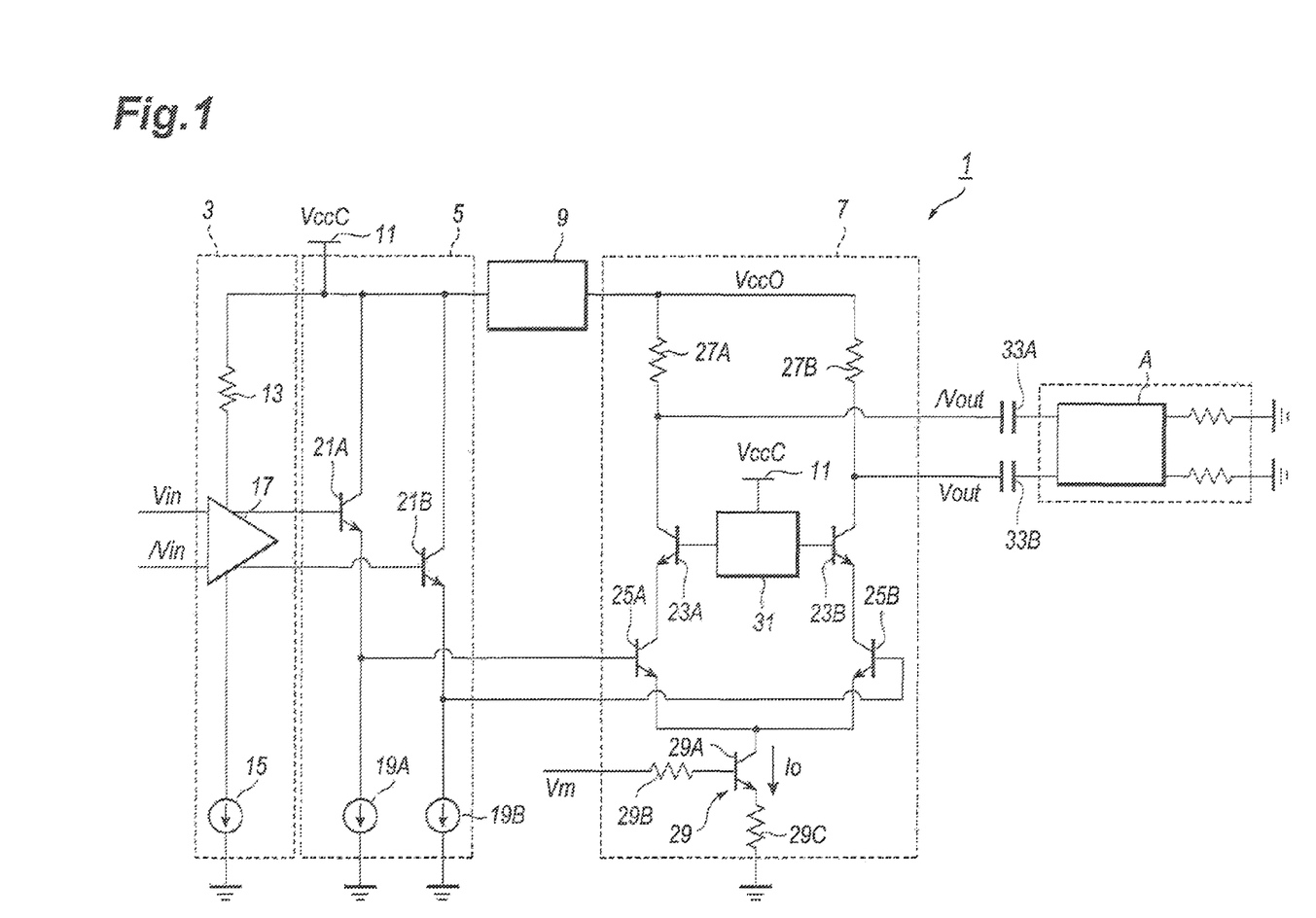
FIG. 1 shows a circuit diagram of a transmitter optical module including a driver circuit according to an embodiment of the present application.

FIG. 1 shows a circuit diagram of a driver circuit according to an embodiment of the present application. The driver circuit 1, which is installed within a transmitter optical module, drives a modulation device A that modulates light emitted from a light source. In another aspect, the driver circuit 1 may directly drive a light source, such as a semiconductor laser diode. The driver circuit 1 includes, as shown in FIG. 1, a front amplifier 3, an emitter follower 5, a rear amplifier 7, a booster 9 put between the front amplifier 3 and the rear amplifier 7, and a bias source 31 to provide a bias to the rear amplifier 7.

The front amplifier 3 includes a differential amplifier 17, a resistor 13, and a current source 15. The differential amplifier 17 is powered by a primary power supply VccC through the resistor 13 and the current source 15. The differential amplifier 17 receives signals, Vin and /Vin, complementary or differential to each other, and outputs amplified signals. In the present specification, a symbol slash "/" means that two signals without the slash and with the slash but a same name subsequent to the slash have phases opposite to each other. That is, two signals with the slash and without the slash are complementary or differential to each other. The emitter follower 5, which includes two transistors, 21A and 21B, and two current sources, 19A and 19B, connected in series to respective transistors, 21A and 21B, between the primary power supply VccC and the ground, receives the outputs of the front amplifier 3. The emitter follower 5 has a function to convert the impedance and the signal level thereof. The input impedance of the emitter follower 5 is enough high; while, the output impedance thereof becomes low. Also, the levels of the outputs pulled out from the emitters of the transistors, 21A and 21B, are lowered by the forwardly biased junction voltage between the base and the emitter.

The booster 9 receives a voltage of the primary power supply VccC through the front amplifier 3 and boosts the primary power supply VccC up to a higher voltage to provide this voltage to the rear amplifier 7 as the secondary power supply VccO. The secondary power supply VccO is set to be, for instance 8 V, while the primary power supply is 13 V in the present embodiment. One example of the booster 9 is LT3467a commercially available from Linear Technology.

The rear amplifier 7 includes a pair of cascade transistors, 23A and 23B, a pair of switching transistors, 25A and 25B, a pair of load resistors, 27A and 27B, and a current source 29, where they are connected in series between the secondary power supply VccO and the ground. That is, the switching transistors, 25A and 25B, are supplied with the secondary power supply VccO through the load resistors, 27A and 27B, and the cascade transistors, 23A and 23B; while, the emitters of the switching transistors, 25A and 25B, are commonly grounded through the current source 29. The switching transistors, 25A and 25B, in the bases thereof receive the outputs of the emitter follower 5. The cascade transistors, 23A and 23B, are biased in the base thereof by the bias source 31. A feature of the present rear amplifier 7 is that the bias source 31 is supplied with the primary power supply VccC, not the secondary power supply VccO of the rear amplifier 7. The current source 29, which includes a transistor 29A, a base resistor 29B, and an emitter resistor 29C, provides a current $I_0$ to the switching transistors, 25A and 25B, depending on the control signal Vm applied to the base though the base resistor 29B. The current $I_0$ determines the amplitude of the outputs of the rear amplifier 7. The cascade transistors, 23A and 23B, are implemented to reduce the Miller effect of the switching transistors, 25A and 25B, at frequencies higher than 25 GHz.

The rear amplifier 7 thus configured provides the outputs, Vout and /Vout, from the collectors of the cascade transistors, 23A and 23B. These outputs, Vout and /Vout, are guided to the modulation device A through coupling capacitors, 33A and 33B.

Next, the bias source 31 will be described. When the driver circuit 1 is installed within a transmitter optical module, power supplies are necessary to be powered on sequentially; that is, (1) the primary power supply VccC is first activated, (2) supplying the secondary power supply VccO to the rear amplifier 7 by boosting the primary power supply VccC, and (3) adjusting the current $I_0$ output from the current source 29 by applying the control signal Vm so as to obtain a preset amplitude in the outputs, Vout and /Vout, of the rear amplifier 7. The control signal Vm may be derived from the primary power supply VccC but the control signal Vm becomes substantial value after the secondary power supply VccO is established. The bias source 31 prevents an excessive current flowing in the cascade transistors, 23A and 23B, and excessive biases applied thereto during the sequence above described.

Figure 2:
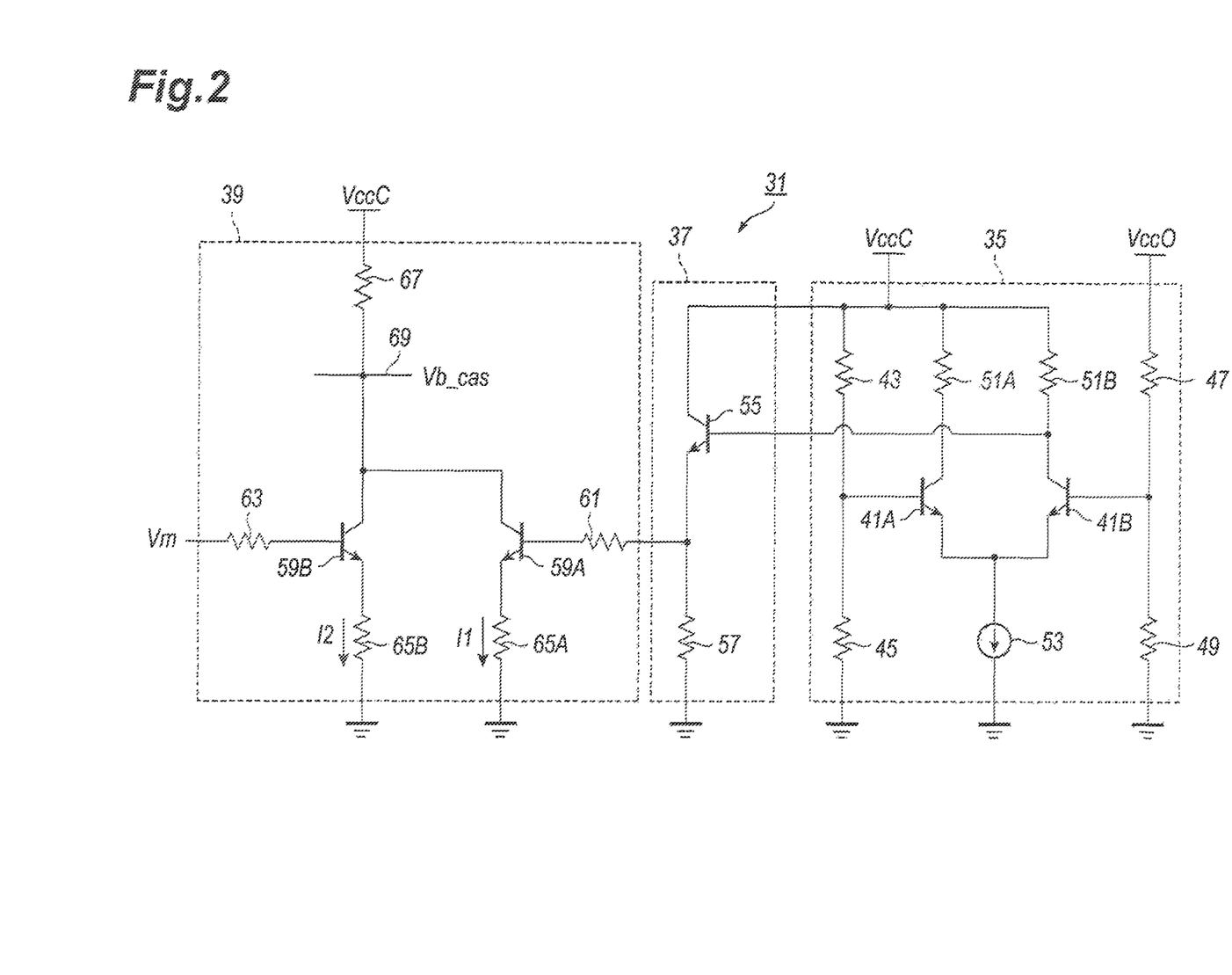
FIG. 2 shows a circuit diagram of a bias source implemented in the driver circuit shown in FIG. 1.

FIG. 2 shows a circuit diagram of the bias source 31. The bias source 31 includes a differential circuit 35, an emitter follower 37 and a balancer 39. The differential circuit 35 includes a pair of transistors, 41A and 41B, a pair of load resistors, 51A and 51B, and a current source 53, where they are connected in series between the primary power supply VccC and the ground. The base bias of one of the transistors 41A is given by a resistive divider of two resistors, 43 and 45, put between the primary power supply VccC and the ground; while, the base bias of the other transistor 41B is given by another voltage divider consisting of two resistors, 47 and 49, connected in series between the secondary power supply VccO and the ground. Thus, the transistor 41A is biased by the primary power supply VccC while the other transistor 41B is biased by the secondary power supply VccO.

The emitter follower 37 includes a transistor 55 and an emitter resistor 57 connected in series between the primary power supply VccC and the ground. The emitter follower 37 receives the output of one of the transistors 41B of the differential circuit 35, and outputs from the emitter thereof to the balancer 39 by lowering the level of the collector output of the transistor 41B by the forwardly biased junction between the base and the emitter of the transistor 55.

The balancer 39 includes two transistors, 59A and 59B, and a collector resistance 67 commonly connected to the collectors of the transistors, 59A and 59B, and two emitter resistors, 65A and 65B, where the collector resistor 67, two transistors, 59A and 59B, and the emitter resistors, 65A and 65B, are connected in series between the primary power supply VccC and the ground. The transistor 59A operates as a current source whose current is controlled by the output of the differential circuit 35; while, the other transistor 59B also operates as a current source whose current depends on the control signal Vm.

The bias source 31 outputs the base bias Vb_cas of the cascade transistors, 23A and 23B, from the collectors 69 common to respective transistors, 59A and 59B. Assuming the current attributed to the transistor 59A is I1, the current flowing in the other transistor 59B is I2, and the resistance of the collector resistor 67 is Rcas, the base bias Vb_cas is given by:

$$Vb\_cas = VccC - Rcas \times (I1 + I2).$$

Next, the operation of the bias source 31 will be described.

First, in the sequence (1) above described, that is, under a condition where the primary power supply VccC is powered on but the secondary power supply VccO is still turned off; also the current I2 is substantially zero because the control signal Vm is left inactive. As for the differential circuit 35, the transistor 41A turns on while the other transistor 41B turns of because the former transistor 41A in the base thereof is biased by the primary power supply VccC but the latter transistor 41B is biased by the secondary power supply VccO. Accordingly, the current determined by the current source 53 flows only in the former transistor 41A, which makes the collector of the latter transistor 41B substantially equal to the primary power supply VccC.

Thus, the transistor 59A in the balancer 39 turns on because the base bias thereof is given by the collector of the transistor 41B through the emitter follower 37; and the current I1 flows in the transistor 59A and the collector resistor 67. Then, the base bias Vb_cas is determined by the voltage drop caused at the collector resistor 67 by the current I1. Setting the current I1 enough to cause a large voltage drop in the collector resistor 67, the base bias Vb_cas is set enough low to turn off the cascade transistors, 23A and 23B.

After the sequence (2), the booster 9 activates the secondary power supply VccO, but the control signal Vm is still inactive, where the base bias of the transistor 41B of the differential circuit 35 becomes substantial to activate the transistor 41B. This condition reverses the outputs of the differential circuit, that is, the base bias of the transistor 59A of the balancer 39 becomes low enough to turn off the transistor 59A. Then, the current I1 in addition to the other current I2 is cut off and the level of the common collector 69, namely, the base bias Vb_cas of the cascade transistors, 23A and 23B, becomes substantially equal to the primary power supply VccC, which turns on the cascade transistors, 23A and 23B.

At the sequence (3) above, the control signal Vm finally becomes active to adjust the current flowing in the rear amplifier 7, which means that the current I2 in the transistor 59B of the balancer 39 flows to cause a substantial voltage drop at the collector resistor 67, that is, the base bias of the cascade transistor Vb_cas is given by:

$$Vb\_cas = VccC - Rcas \times I2.$$

Thus, the cascade transistors, 23A and 23B, are adequately biased.

Figure 4:
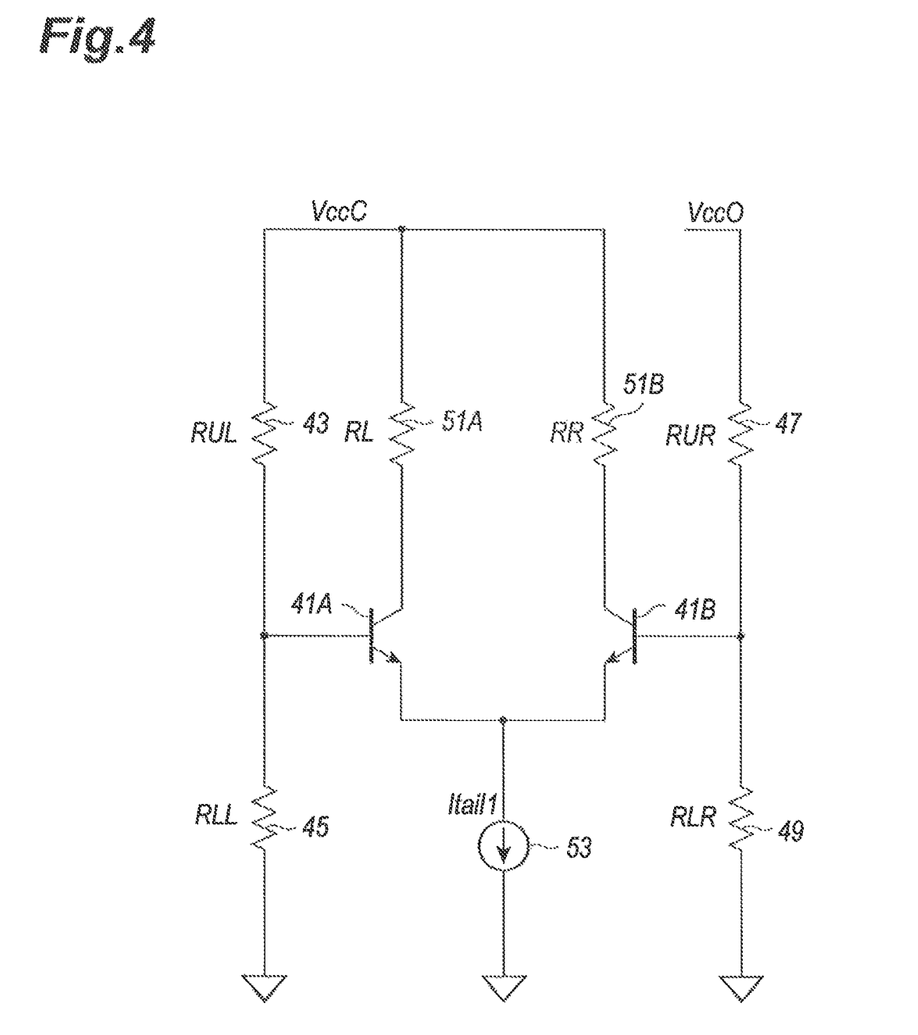
FIG. 4 extracts the differential amplifier in the bias source when two power supplies, VccC and VccO, are active.
Figure 5:
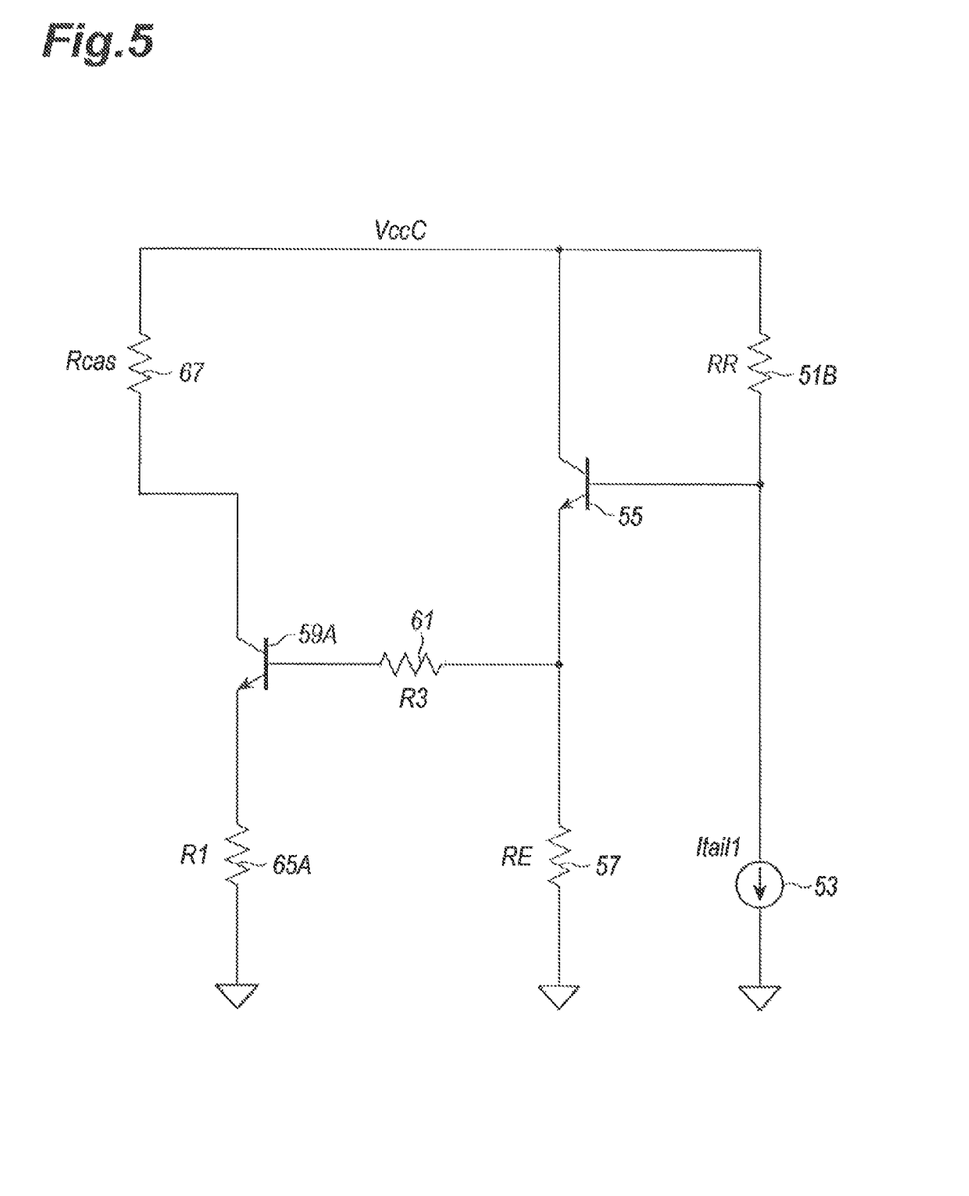
FIG. 5 extracts active elements of the bias source when the secondary power supply becomes active.

Next, an algorithm to determine parameters of circuit elements contained in the bias source 31 will be explained as referring to FIGS. 3 to 5.

Figure 3:
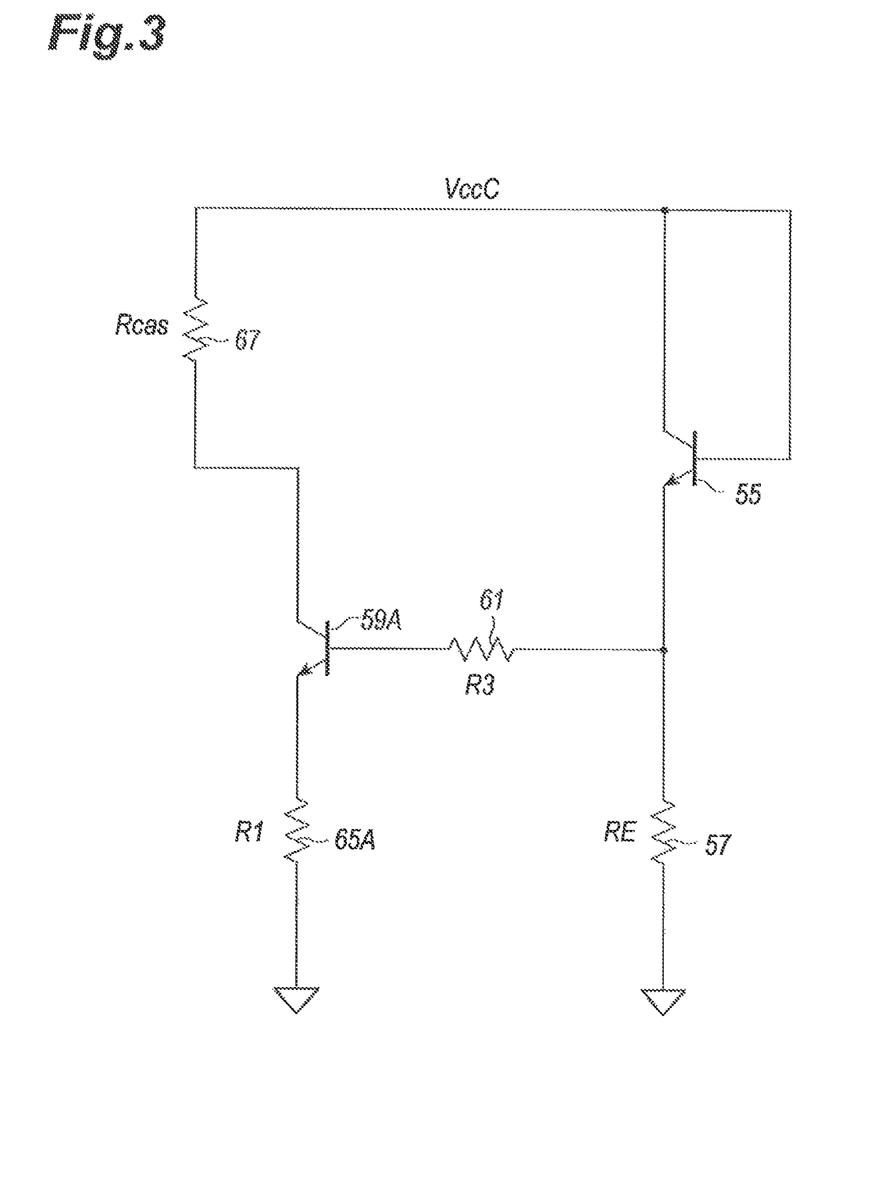
FIG. 3 extracts active elements of the bias source shown in FIG. 2 when the primary power supply is active but the secondary power supply is left inactive.

FIG. 3 shows a circuit diagram at the sequence (1) when only the primary power supply VccC becomes active. As described, the base bias of the transistor 41B depends on the secondary power supply VccO, which is equal to zero because the secondary power supply is inactive yet. The transistor 41B turns off and the collector, namely, the base of the transistor 55 in the emitter follower 37, becomes substantially equal to the primary power supply VccC. A current flows in the transistor 55 and the emitter resistor 57 to cause a voltage drop therein, which becomes the base bias of the transistor 59A. On the other hand, because the control signal Vm is still inactive, only the transistor 59A in the balancer 39 is turned on to run the current I1. Then, the collector of the transistor 59A, namely, the base bias Vb_cas of the cascade transistors, 23A and 23B, is given by:

$$Vb\_cas = VccC - I1 \times Rcas \qquad (1),$$

where Rcas is the resistance of the collector resistor 67.

The first condition is that the base bias Vb_cas given by the equation above is lower than a level when the bias source ordinarily operates.

A bipolar transistor inherently has a saturation voltage of about 0.2 to 0.3 V between the collector and the emitter thereof when the transistor fully turns on. Then, assuming the resistance of the emitter resistor 65A is R1, and the transistor 59A fully turns on, the current I1 flowing in the transistor 59A becomes:

$$I1 = (VccC - 0.3)/(R1 + Rcas).$$

Then, the base bias Vb_cas given by the equation (1) becomes:

$$\begin{aligned} Vb\_cas &= VccC - I1 \times Rcas, \\ &= VccC - (VccC - 0.3) * Rcas/(R1 + Rcas) \\ &= (VccC \times R1 + 0.3 \times Rcas)/(R1 + Rcas) \end{aligned}$$

Accordingly, setting two parameters, R1 and Rcas, such that the base bias Vb_cas becomes less than that under the ordinary operation, which is about 2.6 V, and the cascade transistors, 23A and 23B, turn of during the sequence (1) when only the primary power supply VccC becomes active.

During the sequence (2), namely, not only the primary power supply VccC but the secondary power supply VccO becomes active, the resistance of the resistors, 43 to 49, are set so as to satisfy the relation below.

$$VccO \times RLR/(RUR+RLR) - VccC \times RLL/(RUL+RLL) > 1.0 \text{ V},$$

where RUL, RLL, RUR and RLR are the resistance of the resistors, 43 to 49, respectively.

The first member in the left-hand side gives the base bias of the transistor 41B, and the second member gives that of the transistor 41A. That is, the condition by the equation above means that the base bias of the right-hand transistor 41B is set higher than that of the left-hand transistor 41A by about 1.0V. Then, the right-hand transistor 41B turns on while the left-hand transistor 41A turns off to lower the collector output of the transistor 41B. FIG. 5 shows a circuit diagram when the right-hand transistor 41B turns on but the left-hand transistor 41A turns off. Assuming the current attributed to the current source 53 is Itail1, the resistance of the load resistor 51B is RR, the output Vout of the differential circuit 35 is given by:

$$Vout = VccC - RR \times Itail1,$$

and the output of the emitter follower 37 or the base bias of the transistor 59A, which is lowered from the output Vout by the forwardly biased junction voltage between the base and the emitter of the transistor 55, $$Vb = Vout - \sim 0.8V = VccC - RR \times Itail1 - \sim 0.8.$$

Setting the base bias Vb of the transistor 59A so as to turn off the transistor 59A, which is generally less than 0.5V, the transistor 59A turns off and the collector level thereof, namely, the base bias Vb_cas of the cascade transistors, 23A and 23B, becomes substantially equal to the primary power supply VccC, which means that the cascade transistors, 23A and 23B, fully turn on.

Finally, at the sequence (3) where the base bias Vb_cas is lowered from the primary power supply VccC by the gradual increase of the control signal Vin from the ground, the transistor 59B gradually turns on to run a current therein but the other transistor 59A is still turned off. Setting the control signal Vm in a predetermined level, the base bias Vb_cas becomes a designed value.

The transistors, 59A and 59B, shown in FIG. 2, accompany with emitter resistors, 65A and 65B, that operate as a current feedback element. However, these emitter resistors, 65A and 65B, are removable; that is, the emitters of the transistors, 65A and 65B, may be directly grounded. In such an arrangement, the collector-emitter saturation voltage Vce, which is typically about 0.3 V, is set as the base bias Vb_cas when only the primary power supply VccC is active at the sequence (1) above described, and the collector-emitter bias Vce of the transistor 59B adjusted by the control signal Vm becomes the base bias Vb_cas at the sequence (3). The sequence (2) keeps the condition where the base bias Vb_cas is set substantially equal to the primary power supply VccC. Without the emitter resistor, the current gain of the intrinsic transistor is directly reflected in the collector current. Thus, the emitter resistor 65B makes it easy to adjust the current precisely.

The driver circuit 1 provides the primary power supply VccC to the front amplifier 3, while, the secondary power supply VccO, which is boosted from the primary power supply VccC, is provided to the rear amplifier 7, which enables to set an enough bias Vce between the collector and the emitter of the cascade transistors, 23A and 23B, in the rear amplifier 7 even the rear amplifier 7 has no pull-up resistors. The driver circuit 1 may provide the output thereof with enough amplitude without enlarging the circuit size. Moreover, the bias source 31 to provide the base bias Vb_cas to the cascade transistors, 23A and 23B, effectively prevents the excessive current flowing therein during a transition period when the primary power supply VccC becomes active but the secondary power supply VccO is still inactive. The bias source 31 also prevents the cascade transistors, 23A and 23B, from being applied with an excessive bias after the secondary power supply VccO becomes active. After the control signal Vm is set in a designed value, the base bias Vb_cas of the cascade transistors, 23A and 23B, is also set in a designed value so as to apply an enough collector-emitter bias to the cascade transistors, 23A and 23B, which is for instance, about 2.6 V in the present embodiment. Thus, the embodiment may provide the driver circuit 1 installed within a compact optical module without increasing the power consumption thereof, prevent the circuit elements, namely, the cascade transistors, 23A and 23B, from falling in a failures, and keep the output of the driver circuit 1 stable.

Figure 7:
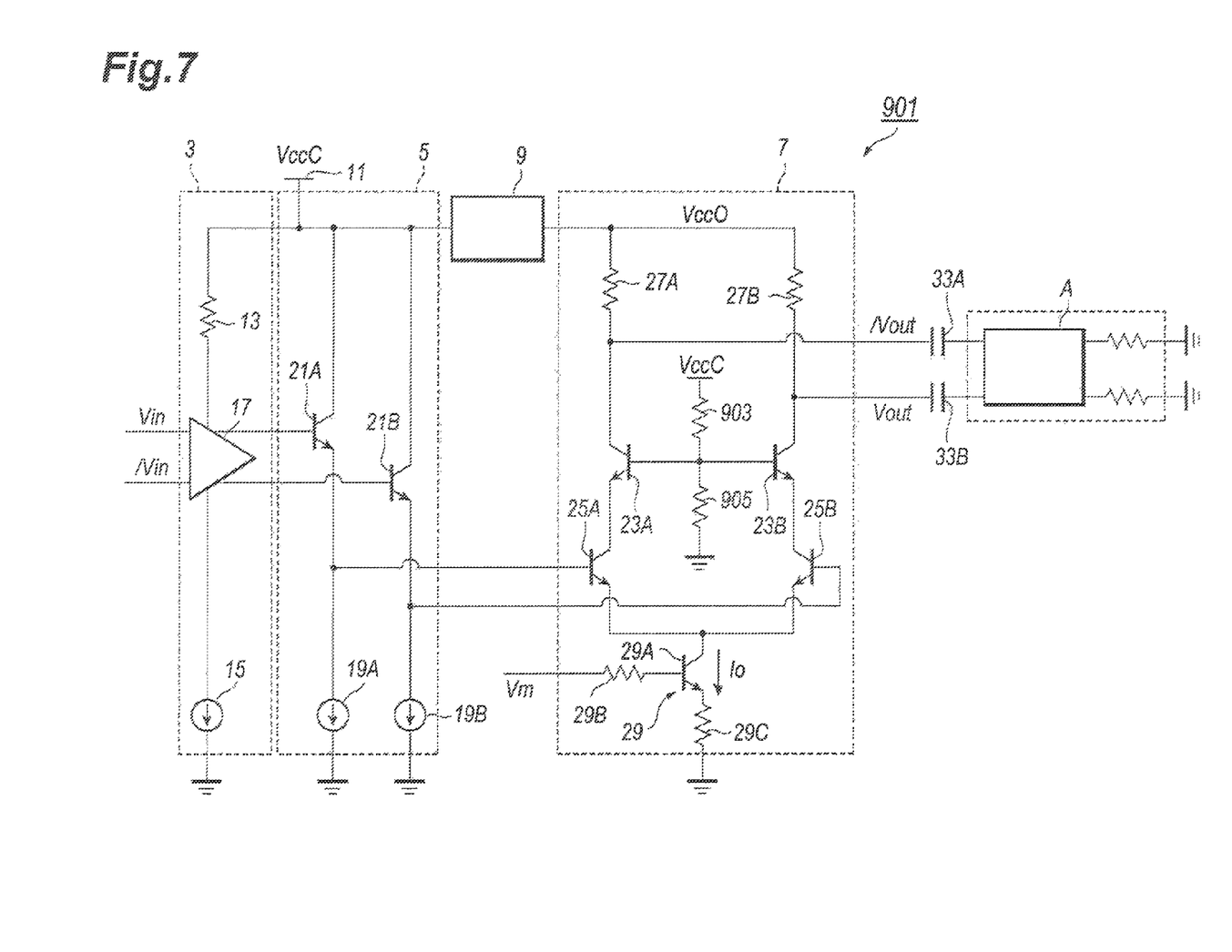
FIG. 7 shows a circuit diagram of another transmitter optical module including a driver circuit comparable to the driver circuit shown in FIG. 1.
Figure 8A:
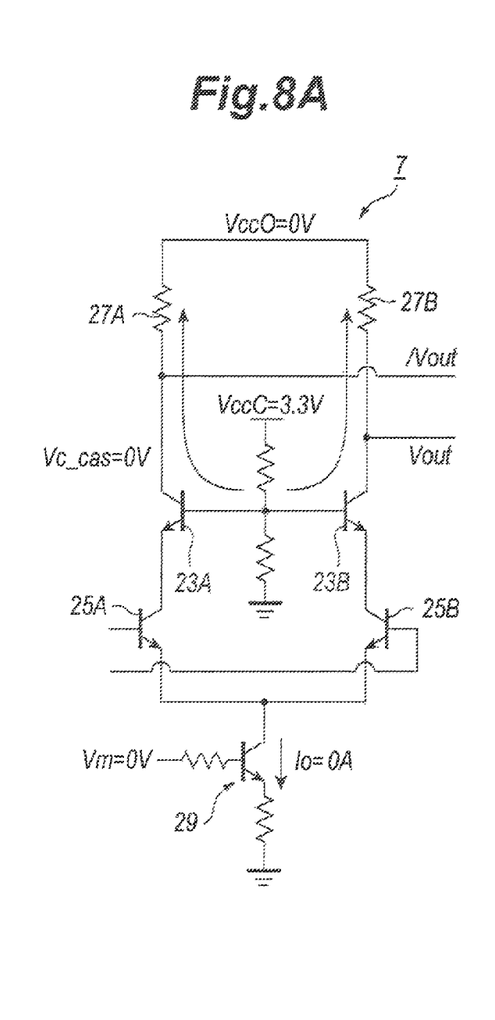
FIG. 8A shows bias levels of the differential amplifier implemented within the comparable driver circuit shown in FIG. 7 when the primary power supply is active but the secondary power supply is left inactive.

The driver circuit 1 of the embodiment will be compared with a comparable example. FIG. 7 is a circuit diagram of a driver circuit 901 comparable with those shown in FIG. 1. The driver circuit 901 has a distinguishable feature compared with those shown in FIG. 1, that the base bias of the cascade transistors, 23A and 23B, is given by a voltage divider including two resistors, 903 and 905, to divide the primary power supply VccC. FIG. 8A shows bias levels of the rear amplifier 7 when the secondary power supply VccO is still inactive, namely, equal to 0 V, while, FIG. 8B shows bias levels of the rear amplifier 7 when both the primary and secondary power supplies are active but the control signal Vm is still inactive, namely, the sequence (3) above described.

As shown in FIG. 8A, the base bias Vb_cas determined by the primary power supply VccC becomes equal to the ordinary level when the rear amplifier operates, which is about 2.6 V in the embodiment. On the other hand, the collectors of the cascade transistors, 23A and 23B, are set to be substantially zero because the secondary power supply VccO is inactive yet. Accordingly, the base-collector junction of the cascade transistors, 23A and 23B, is forwardly biased to run a large current from the base to the collector. The cascade transistors, 23A and 23B, and/or the load resistors, 27A and 27B, is possibly damaged.

Figure 8B:
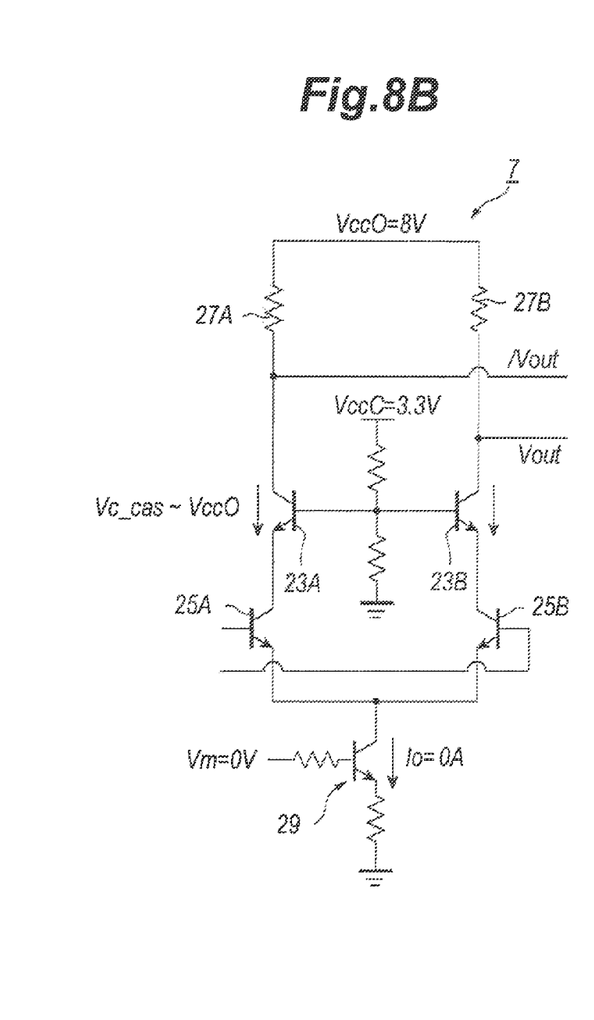
FIG. 8B shows bias levels of the differential amplifier of FIG. 8A when the primary and secondary power supplies are active by the current source is left inactive.

Also, as shown in FIG. 8B, the collectors of the cascade transistors, 23A and 23B, are pulled up to the secondary power supply VccO because the secondary power supply turns active but the control signal Vm is still inactive. Substantially no currents flow through the cascade transistors, 23A and 23B. This condition possibly increases the collector-emitter biases Vce and exceeds the absolute maximum rating of the collector-emitter bias Vce of the transistors, 23A and 23B.

The driver circuit 1 of the present embodiment provides the bias source 31 that variably supplies the base bias Vb_cas to the cascade transistors, 23A and 23B, depending on the sequence to turn the power supplies on, which effectively avoids the possibility that a large current flows in the cascade transistors, 23A and 23B, when only the primary power supply becomes active, and a large collector-emitter bias is applied to the cascade transistors, 23A and 23B, before the control signal becomes active.

Figure 6A:
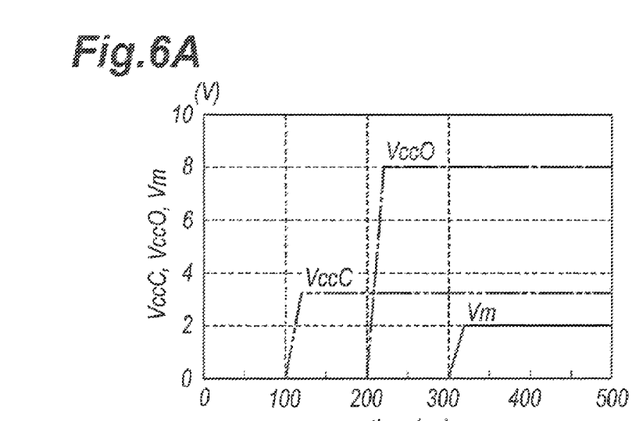
FIGS. 6A to 6D show time variations of two power supplies, VccC and VccO, the control signal Vm; the base bias Vb_cas; the base current Ib_cas; and the collector-emitter bias Vce_cas, respectively.
Figure 6B:
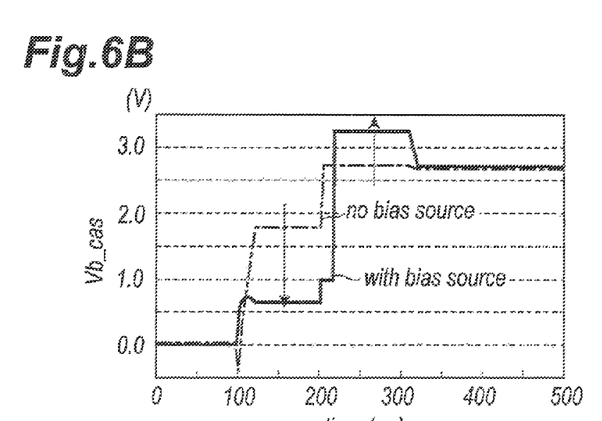
Figure 6C:
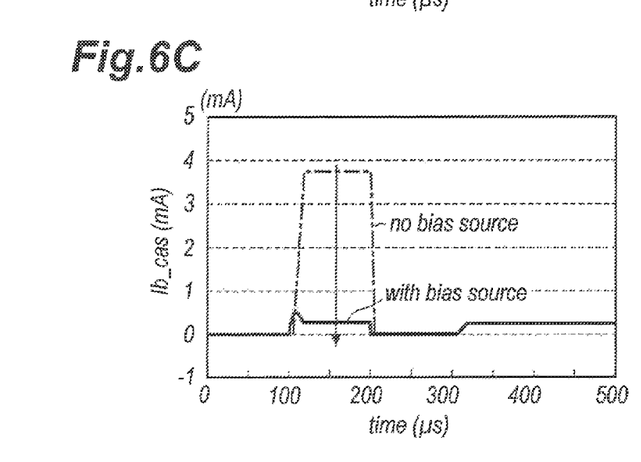
Figure 6D:
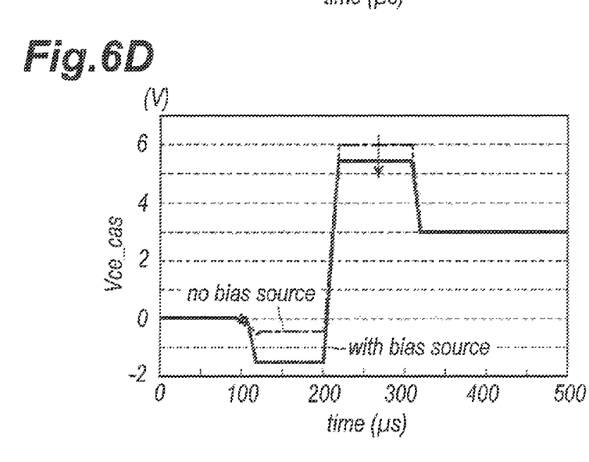

FIGS. 6A to 6D show the time variation of various parameters of the modulation driver of the embodiment shown in FIG. 1, where FIG. 6A shows the sequences of the power supplies, VccC and VccO, and the control signal Vm; and FIGS. 6B to 6C show time variations of the base bias Vb_cas, the base current Ib_cas, and the collector-emitter bias Vce_cas of the cascade transistors, 23A and 23B, respectively.

As shown in FIG. 6B, the base bias Vb_cas is decreased by about 1.2 V, or lowered to about 0.6 V from 1.8 V, during the sequence (1) from 100 μs to 200 μs where only the primary power supply VccC becomes active, which results in the drastic decrease of the current Ib_cas from 3.7 mA to 0.3 mA, as shown in FIG. 6C. In the sequence (2) from 200 μs to 300 μs, the base bias Vb_cas increases by about 0.6 V to reach 3.3 V substantially equal to the primary power supply VccC, which results in the decrease of the collector-emitter bias Vce_cas of the cascade transistors, 23A and 23B, by about 0.6 V. Thus, the bias source 31 of the embodiment effectively decreases the base current Ib and the collector-emitter bias Vce of the cascade transistors, 23A and 23B, in the sequences (1) and (2) above described, respectively.

Although the present invention, has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A driver circuit, comprising:
a front amplifier supplied with a primary power supply;
a rear amplifier put in a downstream of the front amplifier, the rear amplifier being supplied with a secondary power supply higher than the primary power supply, the rear amplifier including a current source, a switching transistor, a cascade transistor, and a load resistor connected in series in this order between a ground and the secondary power supply, the cascade transistor being based by a bias source;
a booster configured to generate the secondary power supply from the primary power supply,
wherein the bias source lowers a base bias of the cascade transistor when the primary power supply becomes active but the secondary power supply is left inactive, and raises to a voltage substantially equal to the primary power supply when both of the primary power supply and the secondary power supply become active but the rear amplifier is left inactive.

2. The driver circuit of claim 1,
wherein the bias source includes a balancer having a resistor and two transistors connected to the resistor, the two transistor in collectors thereof being commonly connected in series to the resistor between the primary power supply and a ground, the bias source outputting the base bias of the cascade transistor from the commonly connected collectors,
wherein only one of two transistors turns on for running a current flowing through the resistor to cause a voltage drop thereat when only the primary power supply becomes active, and
wherein both of two transistors turn off to cause no voltage drop at the resistor.

3. The driver circuit of claim 2,
wherein another of only one of two transistors runs a current to cause a preset voltage drop at the resistor, the preset voltage drop being provided to the base bias of the cascade transistor to regulate a preset current in the rear amplifier.

4. The driver circuit of claim 2,
wherein the bias source further includes a pair of transistors, one of transistors being biased based on the primary power supply, the other of transistors being bias based on the secondary power supply,
wherein the only one of transistors in the balancer receivers an output of the one of paired transistors biased based on the secondary power supply.

5. The driver circuit of claim 4,
further includes an emitter follower to lower a level of the output of the one of paired transistors.

6. The driver circuit of claim 2,
wherein the two transistors in the balancer each has an emitter resistor connected between the emitter and the ground.

7. The driver circuit of claim 1,
wherein the rear amplifier further including another switching transistor, another cascade transistor, and another load resistor, the current source, the two switching transistors, the two cascade transistors, and the two load resistors constituting a differential circuit,
wherein the bias source biases a common base bias of the two cascade transistors.

8. The driver circuit of claim 7,
wherein the current source is controlled by a control signal, and
wherein the control signal is supplied to the bias source to set the base bias of the cascade transistors in a preset value.

9. The driver circuit of claim 1,
wherein the secondary power supply provides a higher supply voltage than the primary power supply.

10. A transmitter optical module, comprising:
a front amplifier having a differential arrangement;
a rear amplifier having the differential arrangement and having a pair of load resistors, a pair of cascade transistor, a pair of switching transistor, and a current source each connected in series between the primary power supply and a ground;
a primary power supply to power the front amplifier
a secondary power supply to power the rear amplifier;
a booster to generate the secondary power supply from the primary power supply; and
a semiconductor optical device driven by the rear amplifier, wherein
the rear amplifier further includes a bias source powered by the primary power supply,
the bias source provides a base bias to the pair of cascade transistors,
the base bias reduces a base current flowing in a base of the cascade transistors when the primary power supply becomes active but the secondary power supply is left inactive, and the base bias rises to a voltage substantially equal to the primary power supply when the primary power supply and the secondary power supply are active but the current source of the rear amplifier is left inactive.

11. The transmitter optical module of claim 10,
further including an emitter follower to shift an output level of the front amplifier down to an input level of the rear amplifier.

12. The transmitter optical module of claim 10,
further including two coupling capacitors put between an output of the rear amplifier and the semiconductor optical device,
wherein the semiconductor optical device is driven in AC mode through the coupling capacitors.

13. The transmitter optical module of claim 10,
wherein the front amplifier is powered by the primary power supply through a resistor and a current source.

14. The transmitter optical module of claim 10,
wherein the semiconductor optical device is a semiconductor modulator.

15. The transmitter optical module of claim 10,
wherein the semiconductor optical device is a semiconductor laser diode.

16. The transmitter optical module of claim 10,
wherein the bias source includes a differential circuit and a balancer, the differential circuit in the bias source having a pair of transistors, one of the paired transistors being controlled based on the primary power supply and another of the paired transistor being controlled based on the secondary power supply, the balancer including two transistors and a resistor connected in series to two transistors between the primary power supply and the ground, one of two transistors in the balancer being controlled by an output of the another of the paired transistors, another of two transistors being controlled by a control signal gradually increasing after the secondary power supply being active.

17. The transmitter optical module of claim 16,
wherein the base bias is determined by a voltage drop caused in the resistor in the balancer and a current flowing through one of two transistors controlled by the output of the another of the paired transistors when the primary power supply becomes active but the secondary power supply is left inactive, and
wherein the base bias is set substantially equal to the primary power supply by turning off the two transistors in the balancer when the primary power supply and the secondary power supply become active but the control signal supplied to the another of two transistors is left inactive.

18. The transmitter optical module of claim 10,
wherein the primary power supply provides a supply voltage smaller than a supply voltage of the secondary power supply.

* * * * *